US010056382B2

(12) United States Patent
Guo et al.

(10) Patent No.: US 10,056,382 B2
(45) Date of Patent: Aug. 21, 2018

(54) MODULATING TRANSISTOR PERFORMANCE

(71) Applicant: International Business Machines Corporation, Armonk, NY (US)

(72) Inventors: Dechao Guo, Niskayuna, NY (US); Juntao Li, Cohoes, NY (US); Sanjay C. Mehta, Niskayuna, NY (US); Robert R. Robison, Colchester, VT (US); Huimei Zhou, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/297,863

(22) Filed: Oct. 19, 2016

(65) Prior Publication Data

US 2018/0108661 A1    Apr. 19, 2018

(51) Int. Cl.

| H01L 29/76 | (2006.01) |
|---|---|
| H01L 29/66 | (2006.01) |
| H01L 27/092 | (2006.01) |
| H01L 21/8238 | (2006.01) |
| H01L 29/78 | (2006.01) |
| H01L 21/02 | (2006.01) |
| H01L 21/324 | (2006.01) |

(52) U.S. Cl.
CPC ...... *H01L 27/0924* (2013.01); *H01L 21/0214* (2013.01); *H01L 21/0217* (2013.01); *H01L 21/02123* (2013.01); *H01L 21/02164* (2013.01); *H01L 21/324* (2013.01); *H01L 21/823821* (2013.01); *H01L 29/7843* (2013.01)

(58) Field of Classification Search
CPC ............ H01L 29/7846; H01L 29/7843; H01L 21/76224; H01L 27/0924; H01L 21/02123; H01L 21/0214; H01L 21/02164; H01L 21/0217; H01L 21/324; H01L 21/823821; H01L 27/1211; H01L 21/845; H01L 29/66772; H01L 29/7831; H01L 29/785
USPC .... 257/E21.546, E21.632, E21.642, E27.06, 257/368, 369, 213, 347, 365, 386; 438/199, 142, 149, 156, 206, 288
See application file for complete search history.

(56) References Cited

U.S. PATENT DOCUMENTS

| 6,890,808 B2 | 5/2005 | Chidambarrao et al. |
| 7,091,563 B2 | 8/2006 | Chidambarrao et al. |
| 7,279,746 B2 | 10/2007 | Doris et al. |

(Continued)

*Primary Examiner* — Thao X Le
*Assistant Examiner* — Nduka Ojeh
(74) *Attorney, Agent, or Firm* — Cantor Colburn LLP; Vazken Alexanian

(57) ABSTRACT

A method of forming an improved field-effect transistor device is provided. The method includes forming a tensile stressor near a first semiconductor fin. The first semiconductor fin is a fin of an n-channel field-effect transistor. The n-channel field-effect transistor is formed on a substrate. The method also includes forming a compressive stressor near a second semiconductor fin. The second semiconductor fin is a fin of a p-channel field effect transistor. The p-channel field-effect transistor is formed on the substrate. The method can also include forming neutral material over the at least one n-channel and p-channel field effect transistor. The method can also include achieving different device performance by configuring a stressor distance to fin and/or by configuring a stressor volume.

18 Claims, 10 Drawing Sheets

(56) References Cited

U.S. PATENT DOCUMENTS

| | | |
|---|---|---|
| 7,309,637 B2 | 12/2007 | Lee et al. |
| 7,348,611 B2 | 3/2008 | Ieong et al. |
| 7,525,162 B2 | 4/2009 | Yin et al. |
| 7,675,055 B2 | 3/2010 | Ieong et al. |
| 7,675,118 B2 | 3/2010 | Chidambarrao et al. |
| 7,906,384 B2 | 3/2011 | Dyer |
| 8,535,999 B2 | 9/2013 | Adam et al. |
| 8,859,357 B2 | 10/2014 | Choi et al. |
| 2005/0054148 A1 | 3/2005 | Chidambarrao et al. |
| 2005/0093030 A1* | 5/2005 | Doris ............. H01L 21/823807 257/288 |
| 2005/0093078 A1* | 5/2005 | Chan ............. H01L 21/823807 257/374 |
| 2005/0145950 A1 | 7/2005 | Chidambarrao et al. |
| 2006/0057787 A1* | 3/2006 | Doris ............. H01L 21/84 438/153 |
| 2007/0108525 A1* | 5/2007 | Yang ............. H01L 21/823807 257/351 |
| 2008/0026523 A1 | 1/2008 | Lee et al. |
| 2008/0036012 A1* | 2/2008 | Yang ............. H01L 21/8221 257/374 |
| 2008/0054357 A1 | 3/2008 | Chidambarrao et al. |
| 2008/0150037 A1* | 6/2008 | Teo ............. H01L 21/31155 257/374 |
| 2008/0315267 A1* | 12/2008 | Hampp ............. H01L 21/823807 257/288 |
| 2009/0127626 A1* | 5/2009 | Zhu ............. H01L 21/3081 257/368 |
| 2009/0233455 A1 | 9/2009 | Dyer |
| 2010/0001317 A1* | 1/2010 | Chen ............. H01L 21/26506 257/192 |
| 2010/0013024 A1 | 1/2010 | Chidambarrao et al. |
| 2010/0072554 A1* | 3/2010 | Goto ............. H01L 21/823828 257/369 |
| 2010/0140617 A1* | 6/2010 | Kuroda ............. H01L 21/84 257/48 |
| 2013/0029488 A1* | 1/2013 | Cai ............. H01L 21/823807 438/669 |
| 2016/0013314 A1 | 1/2016 | Choi et al. |
| 2016/0035727 A1* | 2/2016 | Brunco ............. H01L 27/0924 257/369 |
| 2017/0338346 A1 | 11/2017 | Kittl et al. |

* cited by examiner

INCOMING WAFER

STRESSOR DEPOSIT + ANNEAL

CMP

US 10,056,382 B2

MODULATING TRANSISTOR PERFORMANCE

BACKGROUND

The present invention generally relates to semiconductor device fabrication methods and their resulting structures. More specifically, embodiments of the present invention relate to fabrication methods and resulting structures for changing performance characteristics of a field-effect transistor, such as, for example, a fin field-effect transistor (finFET).

With contemporary semiconductor device fabrication processes, a large number of semiconductor transistor devices, such as finFETs, can be fabricated in and on at least one wafer. In contrast to planar metal oxide semiconductor field effect transistors (MOSFETs), in a finFET device, a source, drain and channel are built as a three-dimensional fin in or on a semiconductor substrate. The fin serves as the main body of the device. The gate electrode is wrapped over the top and sides of the fin, and the portion of the fin that is under the gate electrode functions as the channel. The source and drain regions are the portions of the fin on either side of the channel that are not under the gate electrode. FinFETs can be built on silicon-n-insulator (SOI) substrates.

SUMMARY

According to one or more embodiments of the present invention, a method of forming a field-effect transistor device is provided. The method includes forming a tensile stressor near a first semiconductor fin. The first semiconductor fin is a fin of an n-channel field-effect transistor. The n-channel field-effect transistor is formed on a substrate. The method also includes forming a compressive stressor near a second semiconductor fin. The second semiconductor fin is a fin of a p-channel field-effect transistor. The p-channel field-effect transistor is formed on the substrate. In one or more embodiments of the present invention, the tensile stressor and the compressive stressor are a neutral stress material.

According to one or more embodiments of the present invention, a structure is provided. The structure includes at least one n-channel field-effect transistor having a first semiconductor fin, formed on a substrate. The structure also includes at least one p-channel field-effect transistor having a second semiconductor fin, formed on the substrate. The structure also includes a tensile stressor formed near the at least one n-channel field-effect transistor. The structure also includes a compressive stressor formed near the at least one p-channel field-effect transistor. In one or more embodiments of the present invention, the tensile stressor and the compressive stressor are a neutral stress material.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1A:
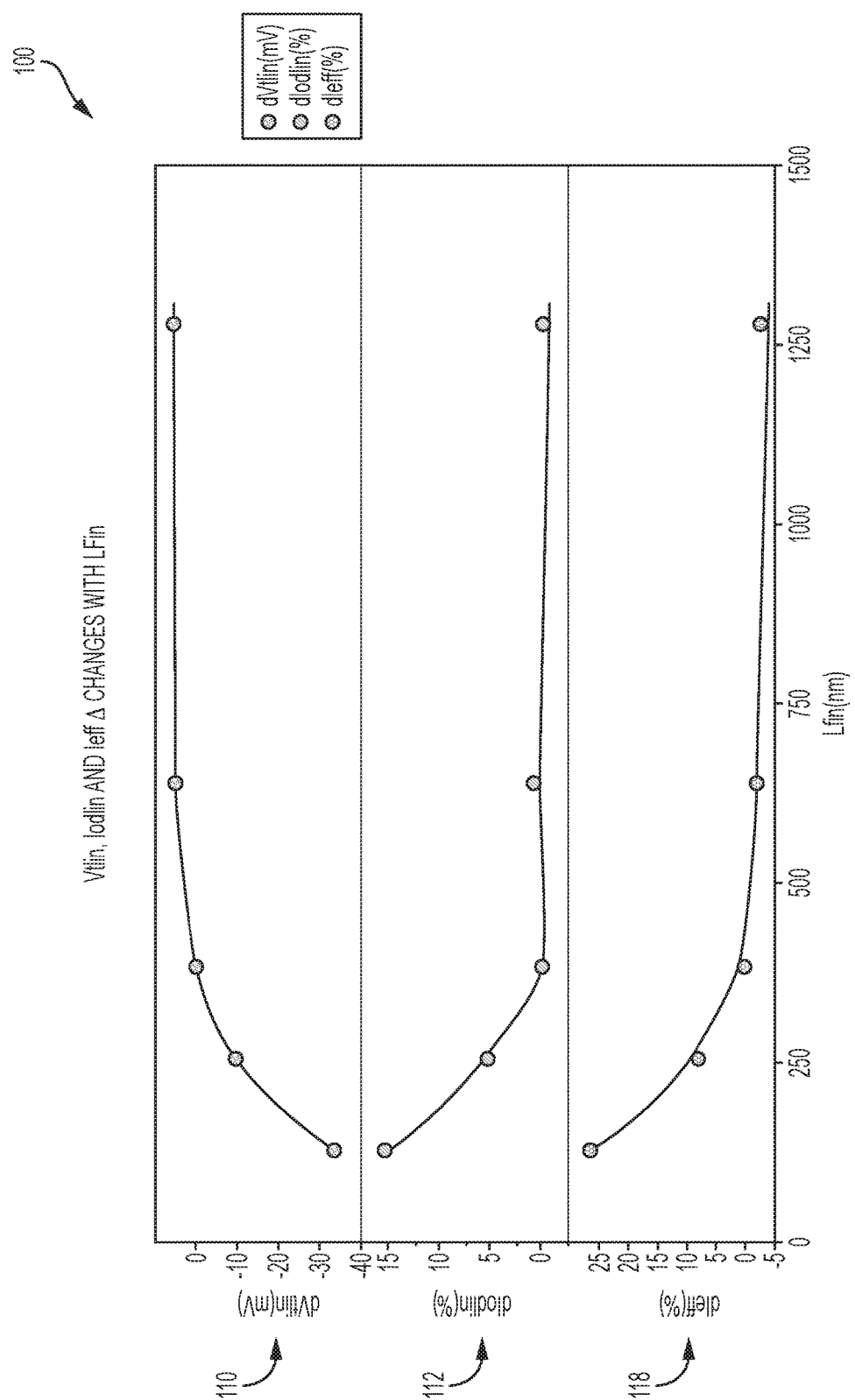
FIG. 1A depicts a graph that illustrates linear threshold voltage ($V_{tlin}$), linear drain current ($I_{odlin}$), and effective drive current ($I_{eff}$) changes of an n-channel finFET (NFET) as fin length changes.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The term "a plurality" is understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, embodiments of the present invention can configure/modify the performance of a semiconductor device by using different fabrication processes and/or by using different layout designs. For example, local variations in the layouts, which can result in corresponding local layout effects (LLE), can change a drive current of a semiconductor device by 10% (or more), and can shift a threshold voltage ($V_t$) by 30 mV or more.

Embodiments of the present invention tune the performance of a finFET device by modifying the length of a fin ($L_{fin}$) of the finFET device. As described in more detail below, modifying the length of the fin (of the finFET device) can change the performance characteristics of the device because effects of induced stress upon the fin's edge can become evident.

As described in more detail below, with embodiments of the present invention, different stressors can be utilized to induce either tensile or compressive stress upon a surrounding area. In one example embodiment, where one specific tensile stressor (such as flowable chemical vapor deposition (FCVD) $SiO_2$) is used, after the material of the tensile stressor is annealed, the material of the tensile stressor generally undergoes shrinkage. With embodiments of the present invention, as the tensile stressor shrinks during the annealing process, the shrinking tensile stressor tends to pull upon its surroundings (i.e., induce a corresponding tensile stress around its surroundings). In particular, the shrinking tensile stressor will induce tensile stress upon nearby fins of finFET devices. Inducing tensile stress at the fin edge (in the middle of a line, for example) will affect the performance of the finFET device to which the fin belongs. As such, with embodiments of the present invention, the performance of a finFET device can thus be modified/configured based upon the amount of tensile stress (or compressive stress) that is applied to the fins of the finFET device.

In view of the above, embodiments of the present invention are directed to a method of performing stressor filling (i.e., the filling of stressor material into a volume of space), as well as performing annealing on the stressor filling, in order to enhance the performance of finFET devices. As described in more detail below, applying tensile stress to an n-channel finFET (NFET) will generally improve the performance of the NFET. On the other hand, applying compressive stress to a PFET will generally improve the performance of the PFET. Further, embodiments of the present invention are also directed to an approach of configuring a distance between a stressor filling and a fin edge. This distance can be changed in order to modify/configure device performance, as described in more detail below. Further, embodiments of the present invention are also directed to using a neutral stress material for stressor filling. By using a neutral stress material for the fillings, embodiments of the present invention can achieve a more uniform device performance in the overall wafer, which improves the overall yield of the process, as described in more detail below. Further, embodiments are also directed to configuring a volume of the stressor filling itself. The volume of the stressor filling can be changed to meet different parameters of device performance, with regard to both the NFET and the PFET devices.

Methods for configuring the performance of fin field-effect transistors and the methods of fabricating the corresponding structures, in accordance with embodiments of the present invention, are described in detail below by referring to the accompanying drawings in FIGS. 1-11B.

FIG. 1A depicts a chart 100 that illustrates linear threshold voltage ($V_{tlin}$), linear drain current ($I_{odlin}$), and effective drive current ($I_{eff}$) changes of an n-channel finFET (NFET) as fin length changes. As shown in chart 100, the performance characteristics of an NFET device are a function of fin length. The performance characteristics include linear threshold voltage ($V_{tlin}$) 110, linear drain current ($I_{odlin}$) 112, and effective current ($I_{eff}$) 118, for example. As shown by chart 100, the shorter the length of a fin, the greater the effective current ($I_{eff}$), where a larger effective current corresponds to an improved device performance. Specifically, the $I_{eff}$ values that are shown on the left-hand side of chart 100 are greater than the $I_{eff}$ values that are shown on the right-hand side of chart 100. Further, the shorter the length of a fin, the lower the threshold voltage ($V_{tlin}$), where a lower threshold voltage also corresponds to an improved device performance.

Figure 1B:
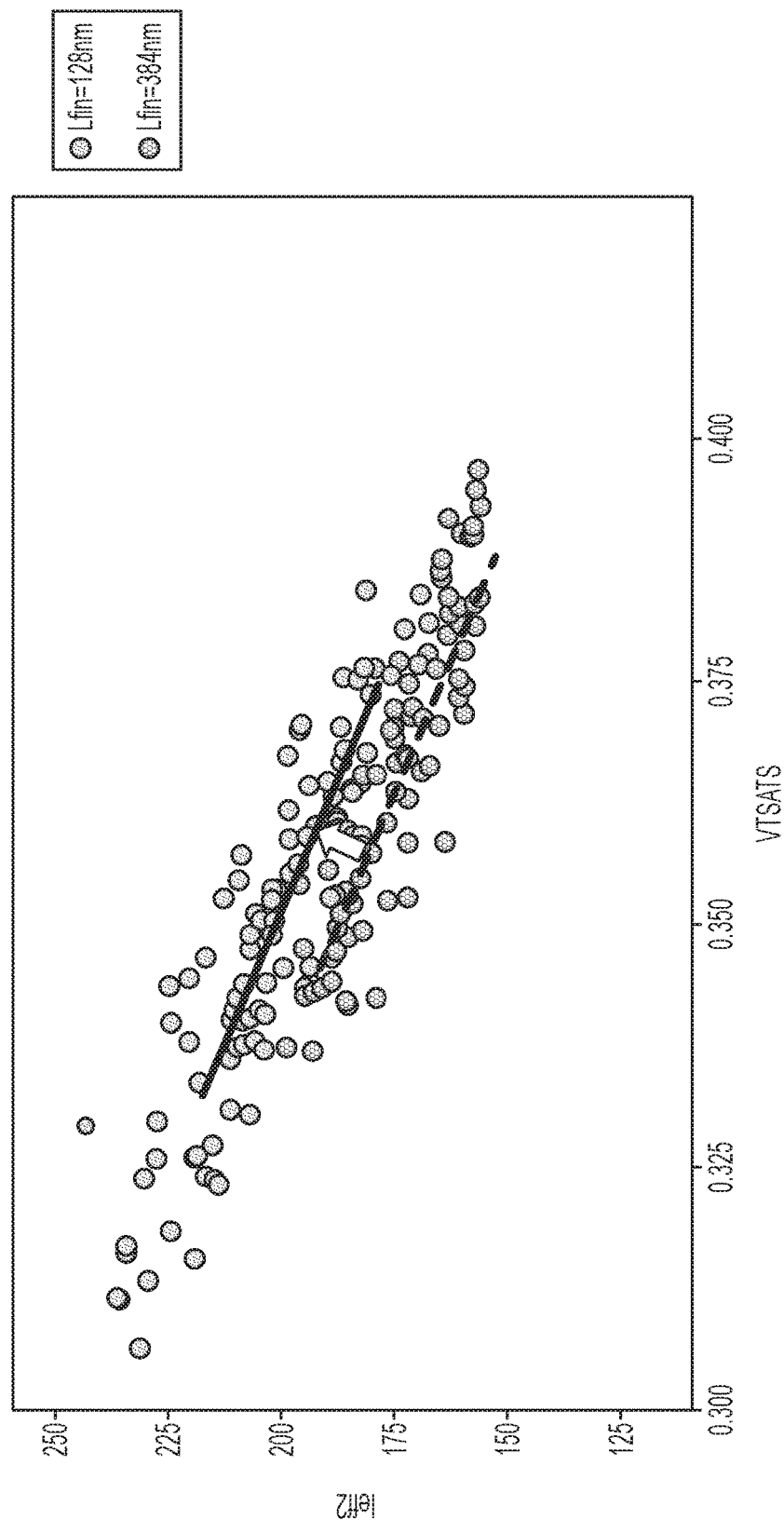
FIG. 1B shows a performance improvement that is achieved when a length of fin ($L_{Fin}$) is shortened to 128 nm from 384 nm, which indicates that when the length of a fin of the NFET device is shortened, device performance is improved, which is in accordance with embodiments of the present invention.

FIG. 1B shows a performance improvement that is achieved when a length of fin ($L_{Fin}$) is shortened to 128 nm from 384 nm, which indicates that when the length of a fin of the NFET device is shortened, device performance is improved. The specific fin lengths of 128 nm and 384 nm are examples. Devices with different $L_{Fin}$ show different $I_{eff}$ vs $V_{tsat}$ performance, which indicates the performance improvement of the device.

Figures 2, 3:
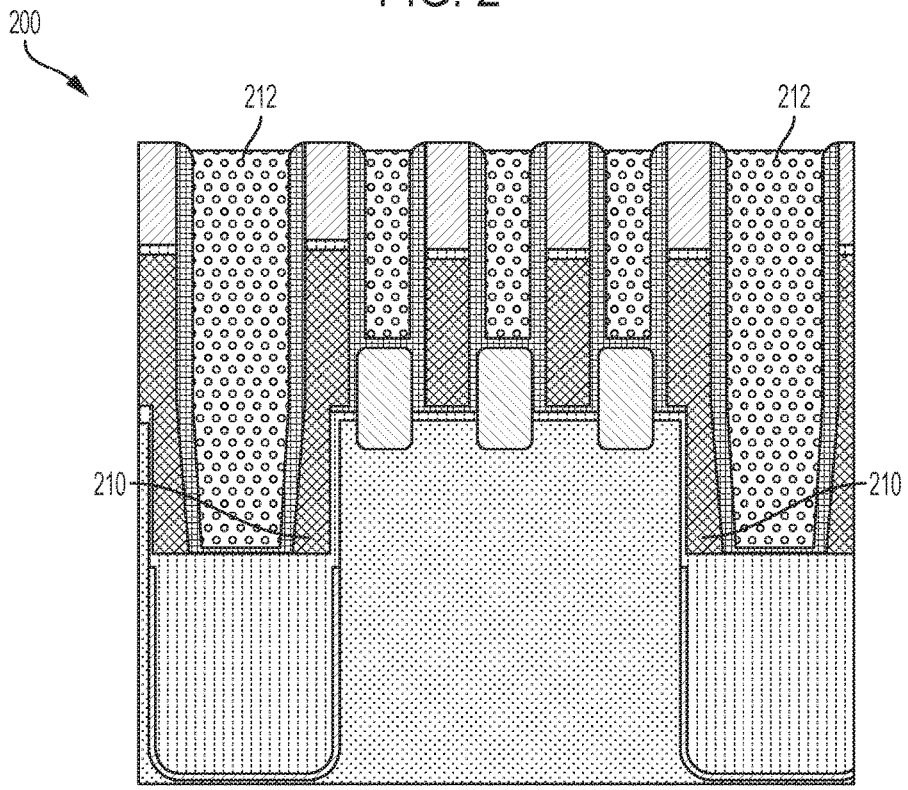
FIG. 2 depicts a table that illustrates that tensile stress is induced after filling a volume of space, near a semiconductor fin, with an amount of stressor material (such as flowable oxide), and annealing the stressor material in accordance with embodiments of the present invention.
FIG. 3 depicts a cross-sectional view of a device, which includes annealed flowable oxide in accordance with embodiments of the present invention.

FIG. 2 depicts a table that illustrates that tensile stress is induced after filling a volume of space, near a semiconductor fin, with an amount of stressor material (such as flowable oxide), and annealing the stressor material in accordance with embodiments of the present invention. As described in further detail below, the stressor material can be positioned a distance between 0 and 200 nm away from the fin, for example. As illustrated by chart 150, nano beam diffraction partition is performed at each specific step, and a certain degree of tensile stress is induced by filling the volume of the space with one kind of material, and then performing annealing, as indicated by the measured "POST POLY PULL" value of T (0.4%), which means a tensile stress with 0.4% lattice constant (taking Si as a reference). The tensile stress is induced when the stressor (such as a flowable oxide (FOX) filling, for example) is filled into a space by flowable chemical vapor deposition (FCVD) and annealed, for example. The FOX filling can be a $SiO_2$ filling, for example.

FIG. 3 illustrates a cross-sectional view of a device 200, which includes annealed FOX in accordance with embodiments of the present invention. Device 200 corresponds to a finFET. In the example device 200 of FIG. 3, FOX fillings 212 are tensile stressor fillings. When FOX fillings 212 are annealed, FOX fillings 212 will generally shrink and induce a tensile strain upon its surroundings 210. Although tensile stressors are specifically shown in the example of FIG. 3, other embodiments can utilize compressive stressors. Compressive stressors are able to provide a compressive stress upon their surroundings, after annealing is performed on the compressive stressors.

Figures 4A, 4B:
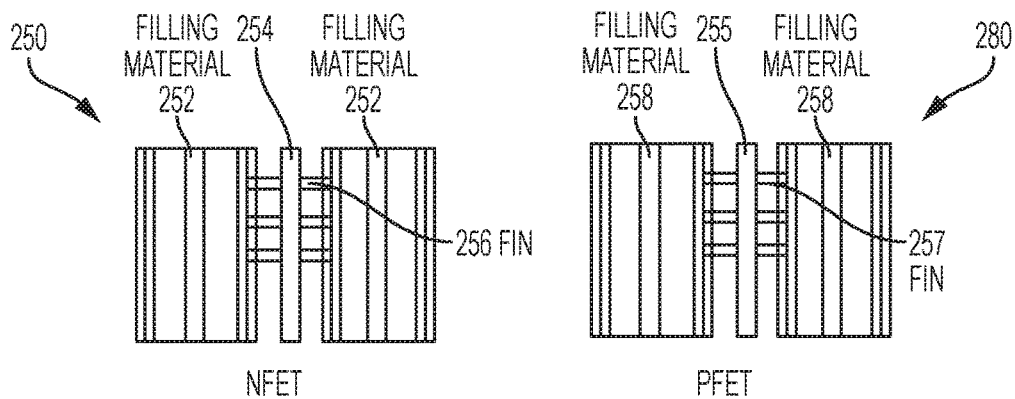
FIG. 4A depicts configuring a filling material to fill a volume of space, near a semiconductor fin, for an n-channel finFET (NFET), in top view, in accordance with embodiments of the present invention.
FIG. 4B depicts configuring a filling material to fill a volume of space, near a semiconductor fin, for a p-channel finFET (PFET), in top view, in accordance with embodiments of the present invention.

FIG. 4A illustrates configuring a filling material to fill a volume of space, near a semiconductor fin, for an n-channel finFET (NFET), in top view, in accordance with embodiments of the present invention. FIG. 4A illustrates a device that is different than the device of FIG. 3. NFET 250 can include a gate 254, a plurality of fins 256, and a filling material 252. The filling material 252 can fill a volume of space within a fin-cut area. In the example of FIG. 4A, it can be desirable to use a filling material 252 that is a tensile stressor, because inducing tensile stress within NFET 250 will generally improve the performance of NFET 250, as described above.

FIG. 4B illustrates configuring a filling material to fill a volume of space, near a semiconductor fin, for a PFET, in top view, in accordance with embodiments of the present invention. PFET 280 can include a gate 255, a plurality of fins 257, and a filling material 258. In the example of FIG. 4B, it can be desirable to use a filling material 258 that is a compressive stressor, because inducing compressive stress within the PFET 280 will generally improve the performance of PFET 280, as described above.

Figure 5A:
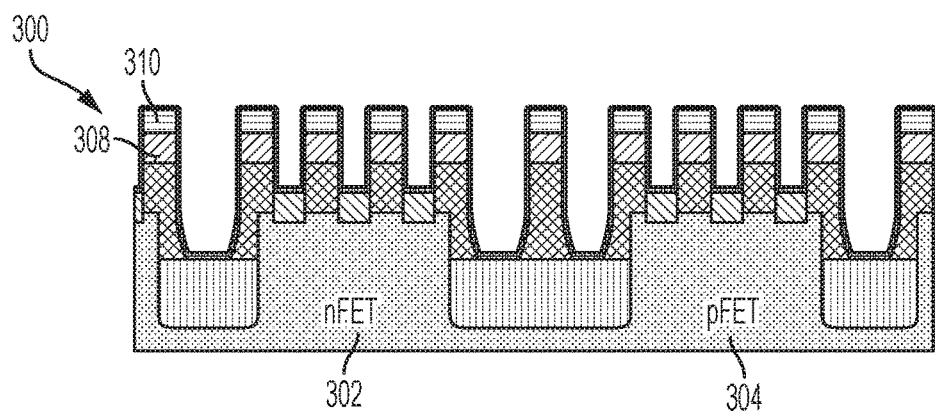
FIG. 5A depicts a cross-sectional view of a finFET device during an example process of depositing a tensile stressor and a compressive stressor in accordance with embodiments of the present invention.

FIG. 5A depicts a cross-sectional view of a finFET device 300 during an example process of depositing a tensile stressor and a compressive stressor, in accordance with embodiments of the present invention. This is an example process, and embodiments of the present invention are not limited to the process mentioned below to induce tensile stress upon a fin of an NFET, and to induce compressive stress upon a fin of a PFET. FinFET device 300 can include a first fin 302 of an NFET and a second fin 304 of a PFET. As shown in FIG. 5A, no stressor filling has yet been applied to finFET device 300. As shown in FIG. 5A, finFET device 300 can also include optional layers of $SiO_2$ 310, and nitride 308, for example.

Figure 5B:
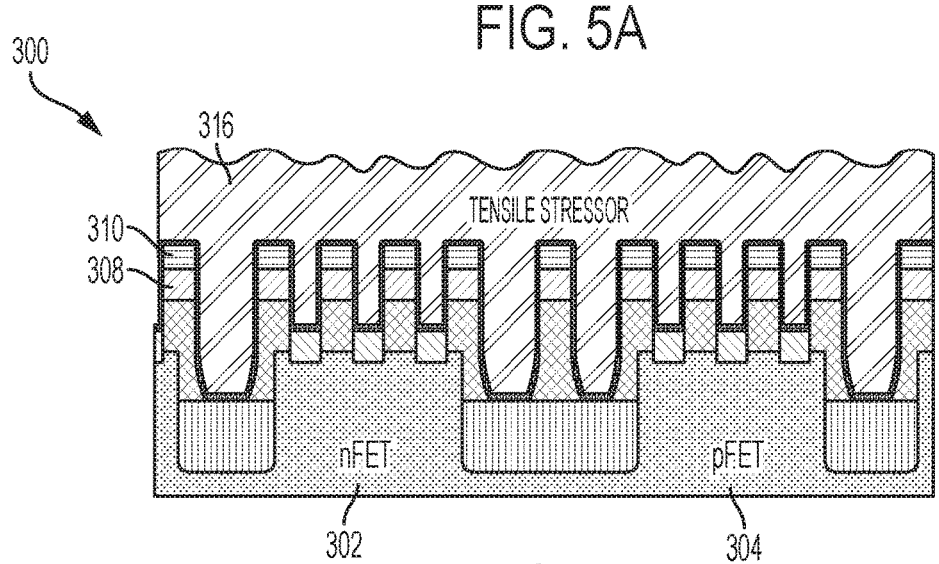
FIG. 5B depicts a cross-sectional view of a finFET during the process of depositing a tensile stressor and a compressive stressor in accordance with embodiments of the present invention.

In FIG. 5B, a tensile stressor 316 (such as an oxide filling, for example) has been applied over finFET device 300.

Figure 5C:
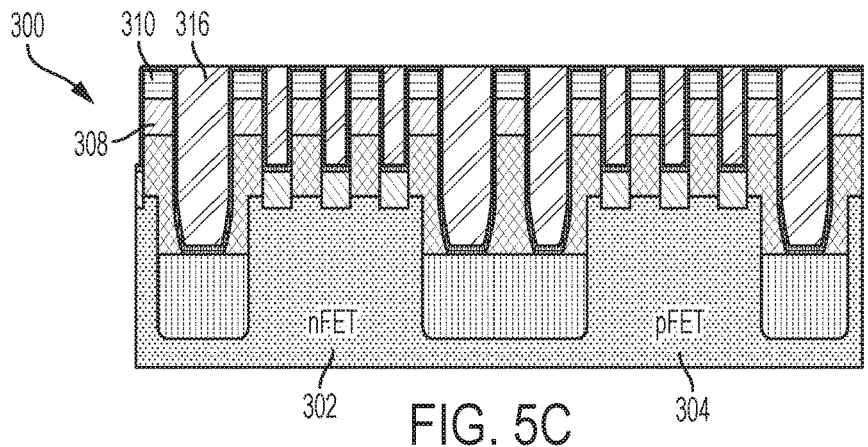
FIG. 5C depicts a cross-sectional view of a finFET during the process of depositing a tensile stressor and a compressive stressor in accordance with embodiments of the present invention.

In FIG. 5C, a process of chemical mechanical planarization can be applied to planarize tensile stressor 316 of finFET device 300.

Figure 5D:
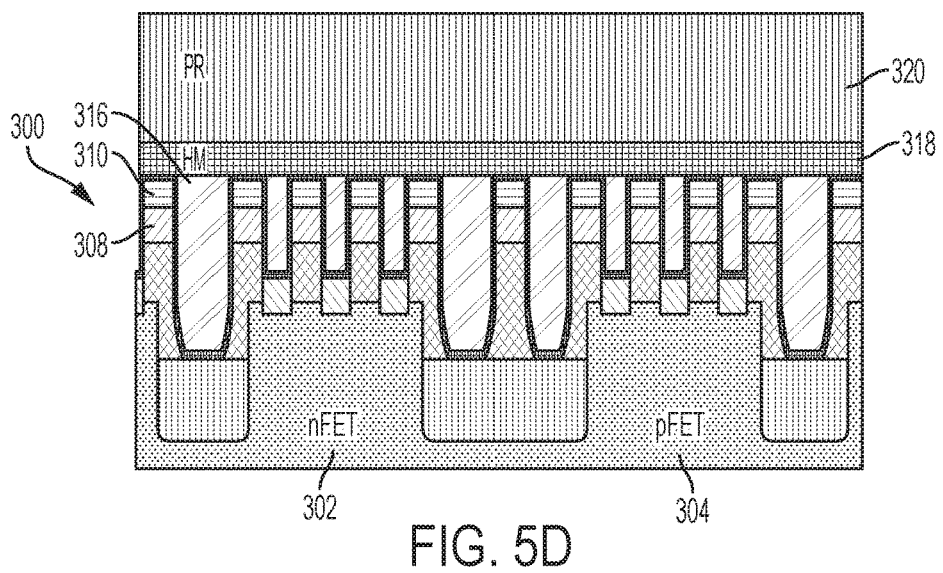
FIG. 5D depicts a cross-sectional view of a finFET during the process of depositing a tensile stressor and a compressive stressor in accordance with embodiments of the present invention.

In FIG. 5D, a hard mask layer 318 and a photoresist layer 320 can be applied onto the top surface of finFET device 300.

Figure 5E:
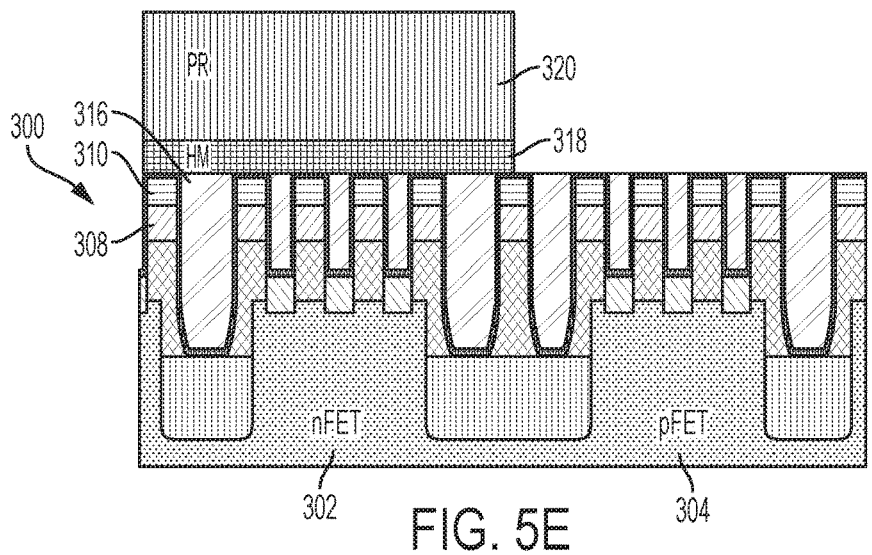
FIG. 5E depicts a cross-sectional view of a finFET during the process of depositing a tensile stressor and a compressive stressor in accordance with embodiments of the present invention.

In FIG. 5E, a process (such as, but not limited to, an etching, ashing, or cleaning process) can be performed to remove the hard mask layer 318 and the photoresist layer 320 from the area over the PFET fin 304, for example.

Figure 5F:
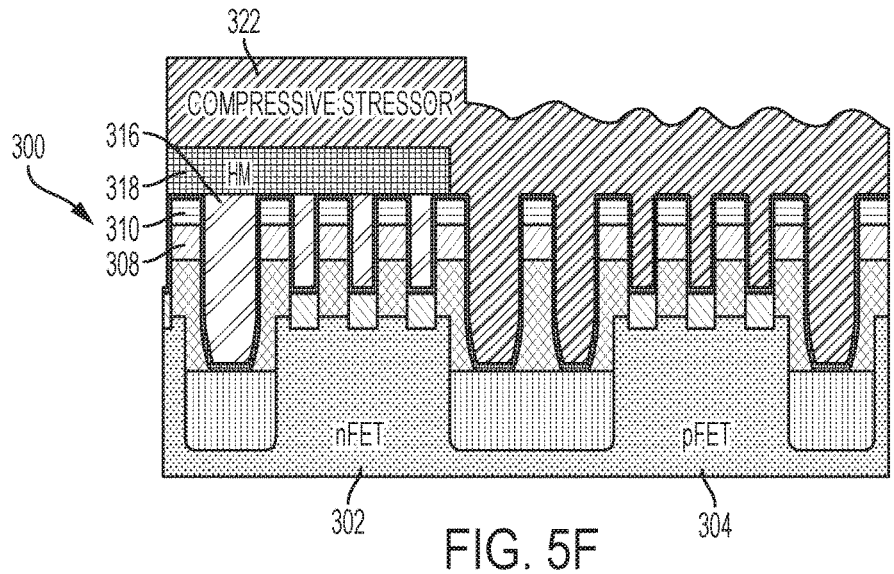
FIG. 5F depicts a cross-sectional view of a finFET during the process of depositing a tensile stressor and a compressive stressor in accordance with embodiments of the present invention.

In FIG. 5F, a compressive stressor 322 can be applied over finFET device 300, specifically over the fin of the PFET. With embodiments of the present invention, the compressive stressor 322 can be optionally annealed here to introduce the compressive stress and tensile stress upon the fins of the NFET and PFET.

Figure 5G:
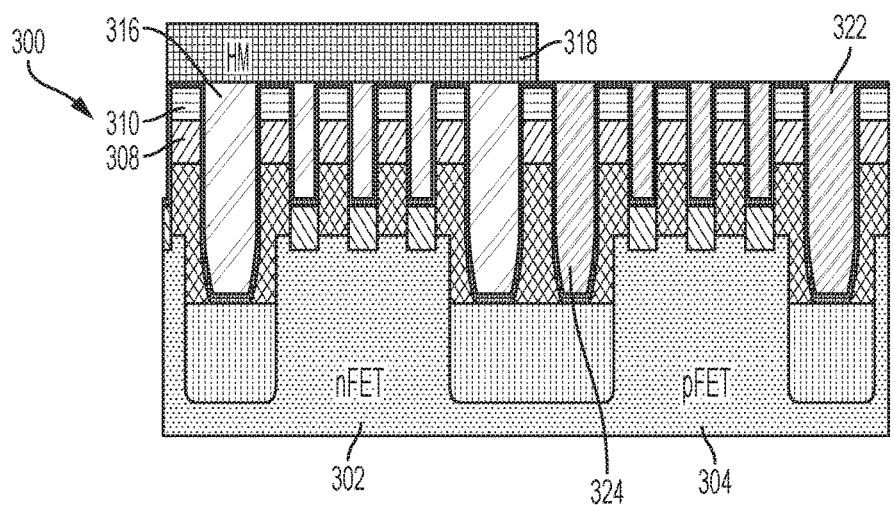
FIG. 5G depicts a cross-sectional view of a finFET during the process of depositing a tensile stressor and a compressive stressor in accordance with embodiments of the present invention.

In FIG. 5G, a process of chemical mechanical planarization, for example, can be applied to finFET device 300. As such, while the tensile stressor is near the NFET fin 302, the compressive stressor is applied near the PFET fin 304 (such as in volume of space 324), for example. With embodiments of the present invention, a further optional annealing process can also be further applied to finFET device 300.

Figure 5H:
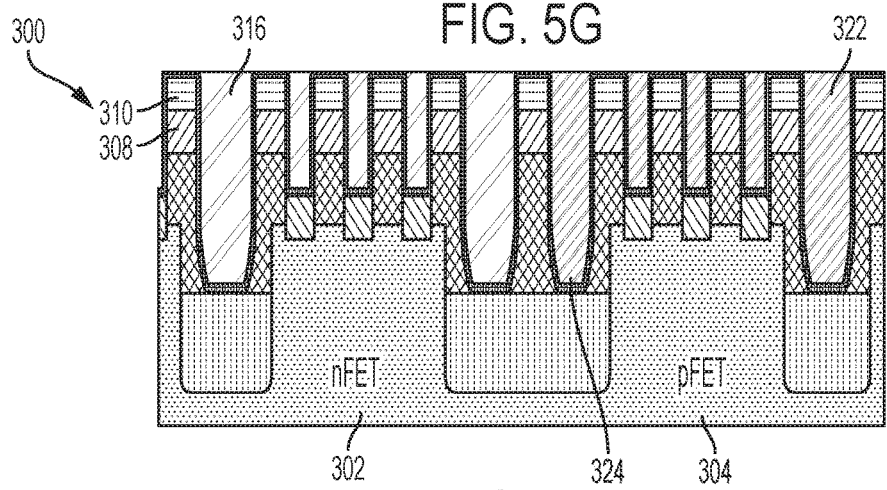
FIG. 5H depicts a cross-sectional view of a finFET, with a deposited tensile stressor and a deposited compressive stressor, in accordance with embodiments of the present invention.

In FIG. 5H, the remaining hard mask layer can be stripped off. With embodiments of the present invention, a further optional annealing process can be applied to finFET device 300.

In view of the process steps illustrated by FIGS. 5A-5H, volumes of space nearby NFET fin 302 are filled with a tensile stressor filling that induces a tensile stress upon NFET fin 302 (thus improving NFET performance), and the volumes of space nearby PFET fin 304 are filled with a compressive stressor filling that induces a compressive stress upon PFET fin 304 (thus improving PFET performance). With embodiments of the present invention, annealing can be performed at any step after FIG. 5F, in order to introduce the corresponding stress. With regard to the NFET tensile stressor, embodiments of the present invention can use an oxide filling material that includes $SiO_2$, applied by flowable chemical vapor deposition, for example. Other embodiments can use an oxide filling material that includes SiON, applied by plasma-enhanced chemical vapor deposition (PECVD), for example. Other embodiments can also use a filling material that includes an amorphous-Si filling, applied by plasma-enhanced chemical vapor deposition, for example. With regard to the PFET compressive stressor, embodiments can use an oxide filling material that includes $SiO_2$, applied by high-density plasma chemical vapor deposition, for example. Embodiments can use an oxide filling material that includes a thicker linear SiN, applied by PECVD, for example.

Figure 6:
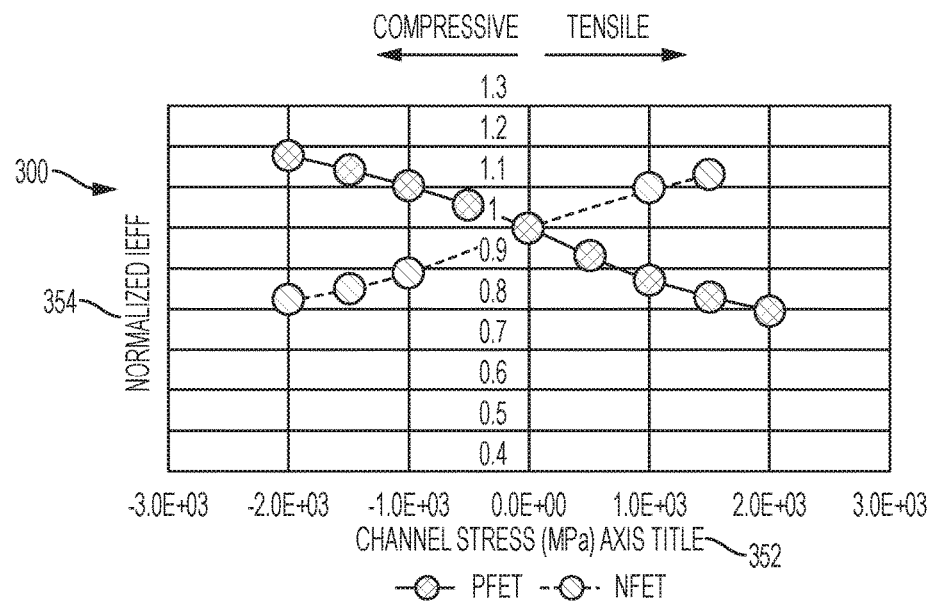
FIG. 6 depicts a graph that illustrates a series of normalized effective current values as a function of channel stress, which was generated by technology computer aided design (TCAD) simulation in accordance with embodiments of the present invention.

FIG. 6 depicts a graph that illustrates a series of normalized effective current values as a function of channel stress, from technology computer aided design (TCAD) simulation, in accordance with embodiments of the present invention. When tensile stress is introduced, which is positive channel stress in the figure, NFET performance improves, while PFET performance degrades. When compressive stress is introduced, which is a negative channel stress in the figure, PFET performance improves, while NFET performance degrades. When NFET is applied with tensile stress and PFET is applied with compressive stress, as a dual stress process, both device performances are improved.

Figures 7A, 7B:
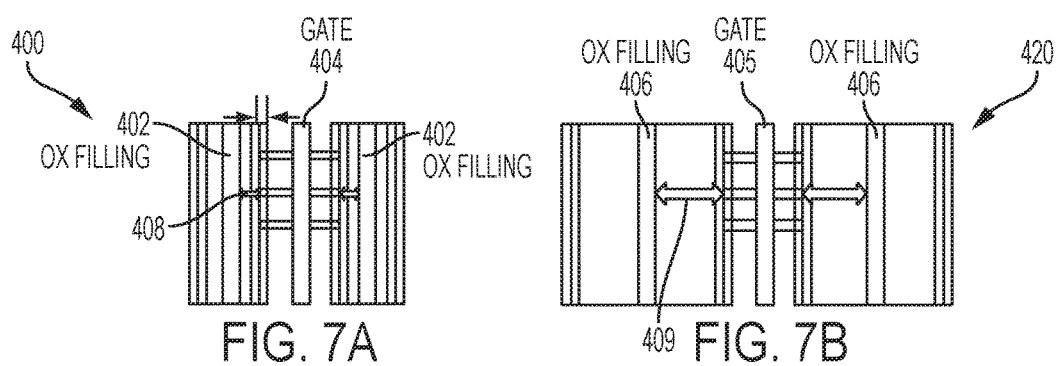
FIG. 7A depicts configuring a first distance between an oxide filling, which fills a volume of space near a fin, and an edge of the fin in accordance with embodiments of the present invention.
FIG. 7B depicts configuring a second distance between another oxide filling, which fills a volume of space near a fin, and another edge of the fin in accordance with embodiments of the present invention.

FIG. 7A depicts configuring a first distance between an oxide filling, which fills a volume of space near a fin, and an edge of the fin, in accordance with embodiments of the present invention. Specifically, referring to FIG. 7A, embodiments can configure the distance between the edge of a stressor (i.e., an oxide filling 402) and the edge of the fin of finFET 400. This configured distance 408 can be within design constraints/rules. In the embodiment shown in FIG. 7A, a relatively short distance is configured between the edge of the filling/stressor and the edge of the fin (as compared to the embodiment shown by FIG. 7B). In general, if the stressor is positioned close to the edge of the fin, the effects of the stressor upon the fin will be more pronounced. For example, if the stressor is a tensile stressor, the induced tensile stress will have a larger effect upon the fin if the tensile stressor is positioned closer to the fin.

FIG. 7B depicts configuring a second distance between another oxide filling, which fills a volume of space near a fin, and another edge of the fin, in accordance with embodiments of the present invention. Specifically, referring to FIG. 7B, embodiments can configure the distance 409 between the edge of the filling/stressor 406 and the edge of the fin. In the embodiment shown by FIG. 7B, a larger distance 409 is configured between the edge of the filling/stressor 406 and the edge of the fin. As such, because the stressor 406 is positioned further away from the edge of the fin, the effects of stressor 406 upon the corresponding fin will be less pronounced.

Figure 8A:
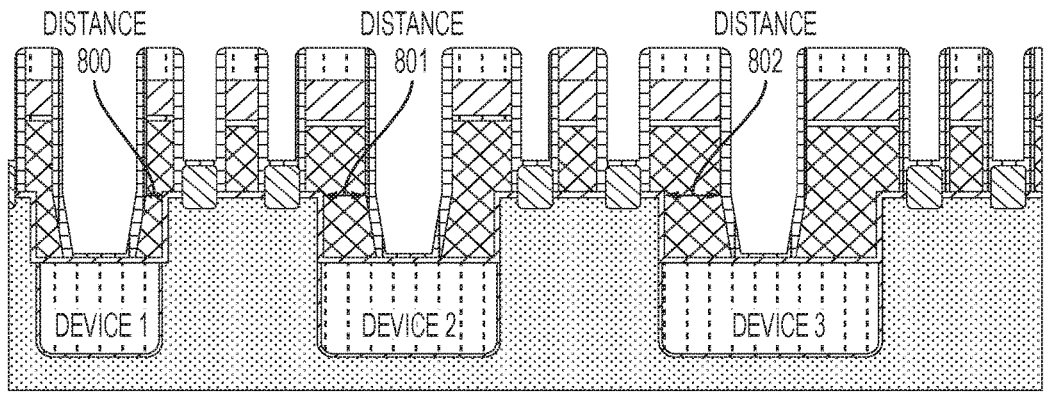
FIG. 8A depicts a cross-sectional view of three different devices on a substrate, where the corresponding distances between the corresponding oxide fillings and the corresponding fin edges of each device are different in accordance with embodiments of the present invention.

FIG. 8A depicts a cross-sectional view of three different devices on a substrate, where the corresponding distances between the corresponding oxide fillings and the corresponding fin edges of each device are different, in accordance with embodiments of the present invention. Each of devices 1-3 has different oxide-filling distances. Specifically, device 1 has a corresponding distance 800 between the stressor/filling (of device 1) and fin edge (of device 1) that is different than the corresponding distances of devices 2 and 3 (distances 801 and 802). Device 1 has the smallest oxide filling distance 800 (i.e., the smallest distance between stressor filling and fin edge), device 2 has a medium oxide filling distance 801, and device 3 has the largest oxide filling distance 802.

Figure 8B:
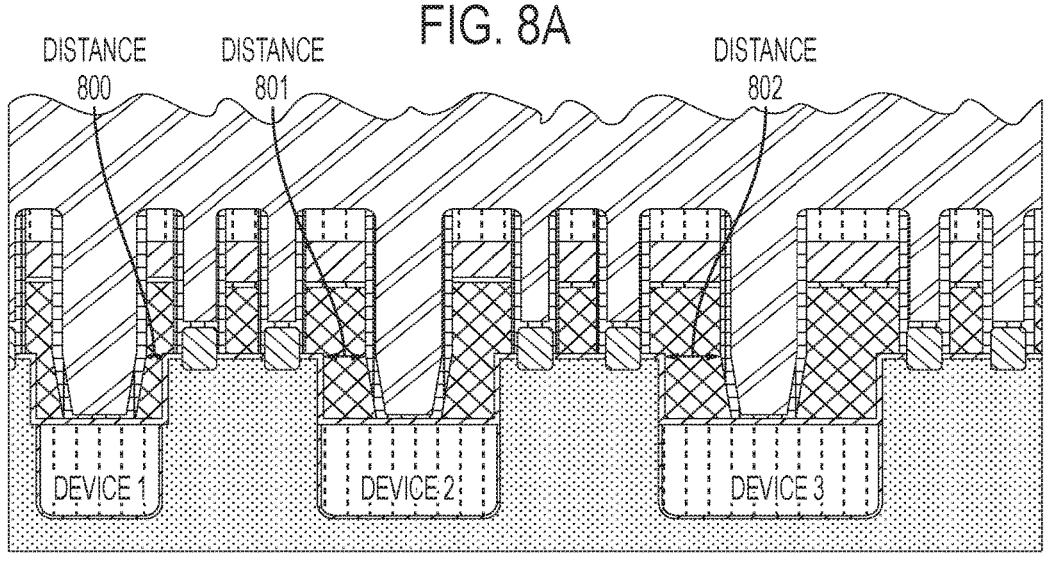
FIG. 8B depicts a cross-sectional view of the three devices on the substrate, during the process of oxide filling, in accordance with embodiments of the present invention.

FIG. 8B depicts a subsequent cross-sectional view of the three devices on the substrate, during the process of oxide filling, in accordance with embodiments of the present invention. Referring to FIG. 8B, a stressor 810 is deposited, and the stressor 810 can be annealed.

Figure 8C:
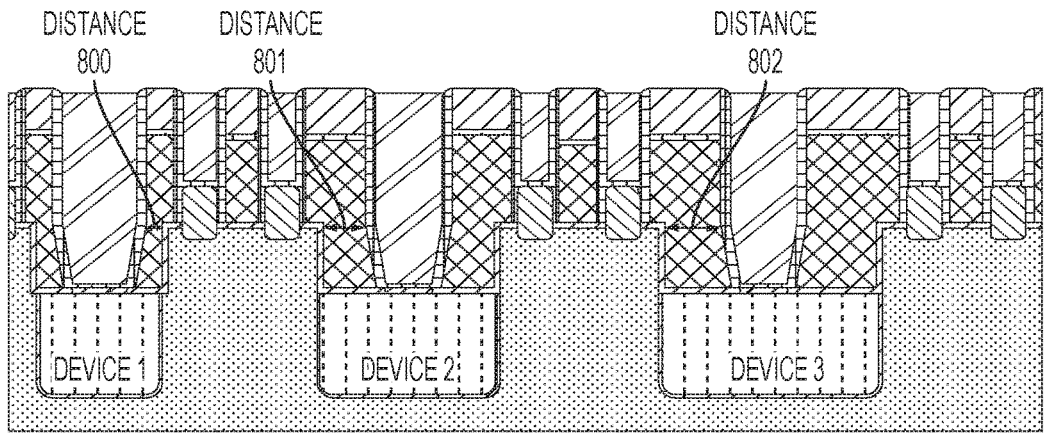
FIG. 8C depicts a cross-sectional view of the three devices on the substrate, during the process of oxide filling, in accordance with embodiments of the present invention.

FIG. 8C depicts a subsequent cross-sectional view of three devices on the substrate, during the process of oxide filling, in accordance with embodiments of the present invention. With embodiments of the present invention, a chemical mechanical planarization process can be applied upon the oxide filling 810, for example.

In view of the above, the effects of induced stress on a device fin will be more pronounced if the distance between the stressor filling and the fin edge is a smaller/shorter distance. For example, if an amount of filled tensile stressor is closely positioned to a fin edge, when annealing is applied, the filled tensile stressor will induce a tensile stress that will have a greater effect upon the closely-positioned fin. As such, in the case of tensile stressors and NFET devices, threshold voltages can be reduced as the distance between the tensile stressor and the fin edge is shortened, in accordance with embodiments of the present invention. As the distance between the tensile stressor and the fin edge shortens, the corresponding threshold voltages decrease. Further, in the case of compressive stressors and PFET devices (which have threshold voltages with negative values), the threshold voltages of PFET devices can be increased (i.e., decreasing the magnitude of the threshold voltage of the PFET devices) as the distance between the compressive stressor and the fin edge is shortened, in accordance with embodiments of the present invention. As the distance between the compressive stressor and the fin edge shortens, the corresponding threshold voltages increase (decreasing the magnitude of the threshold voltage of the PFET devices).

Figure 9:
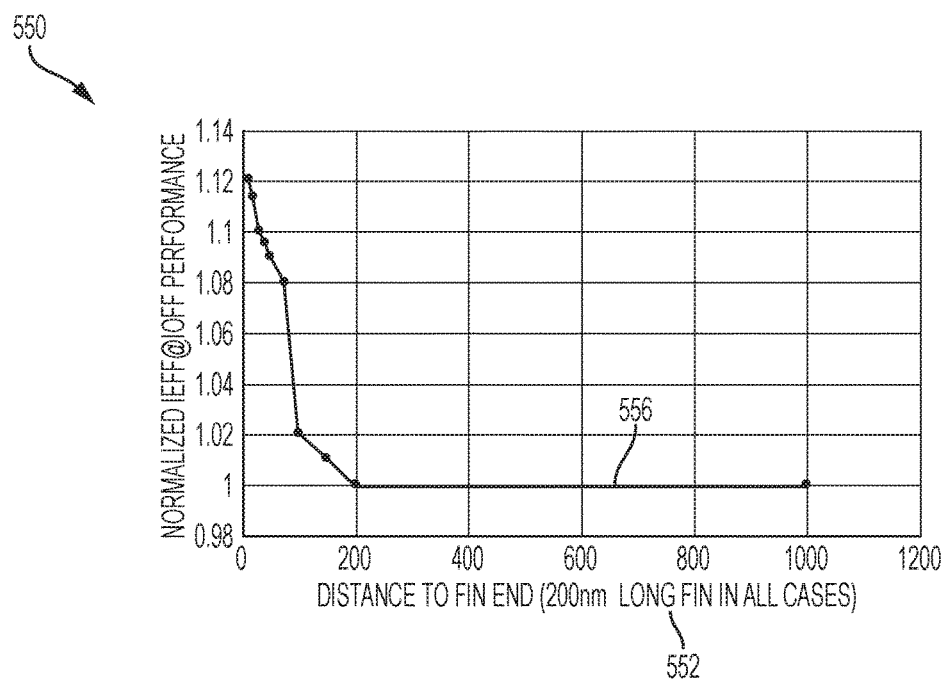
FIG. 9 depicts an example configuration where an effective current ($I_{eff}$) increases as a distance between a stressor and a fin edge decreases, as shown by TCAD simulation, in accordance with embodiments of the present invention.

FIG. 9 depicts an example configuration where the effective current ($I_{eff}$) increases as a distance between a stressor and a fin edge decreases, as shown by TCAD simulation, in accordance with embodiments of the present invention. In the example of FIG. 9, the stressor can be a tensile stressor, and the device can be an NFET device. Referring to chart 550, as the distance 552 between the stressor and the fin edge decreases, the effects of the tensile stressor (upon the NFET device) become more pronounced. Specifically, as the distance decreases, the amount of effective current ($I_{eff}$) 556 increases, corresponding to an improved device performance for the NFET. As shown by FIG. 9, with one or more embodiments of the present invention, improved device performance can occur if the distance between the stressor and the fin end/edge is between around 0 and 200 nm, for example. Embodiments of the present invention can, subject to design rule constraints, position stressors near semiconductor fins, where the stressors can be between around 0 and 200 nm from the fins, for example.

Figure 10A:
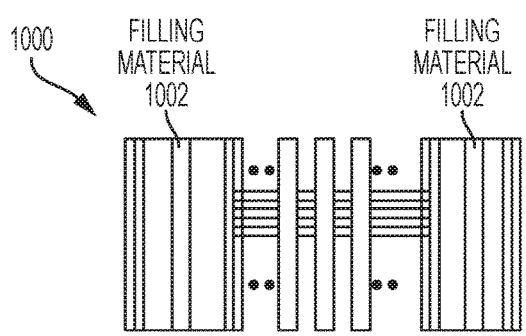
FIG. 10A depicts configuring a filling material to fill a volume of space near a semiconductor fin, while achieving a configuration with neutral stress in accordance with embodiments of the present invention.
Figure 10B:
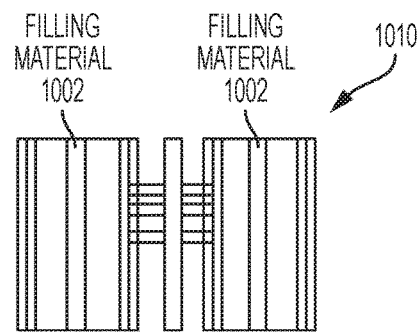
FIG. 10B depicts configuring filling material to achieve a configuration of neutral stress on different layouts in accordance with an embodiment that improves uniformity.

FIGS. 10A and 10B depict configuring a filling material to fill a volume of space near a semiconductor fin, while achieving a configuration with neutral stress, with different fin lengths, which can occur frequently in layouts in integrated circuit (IC) design, in accordance with embodiments of the present invention. FIG. 10A illustrates an example embodiment where the lengths of the fins of device 1000 are long (as compared to the embodiment shown in FIG. 10B). It can be desirable to use filling materials that achieve a neutral stress, which would mitigate the LLE effect caused in the middle of lines, make uniform the device performance on the whole wafer, and improve the overall yield of the whole chip. Embodiments of the present invention can offer promising opportunities in the current manufacturing process of FinFETs.

Figure 11A:
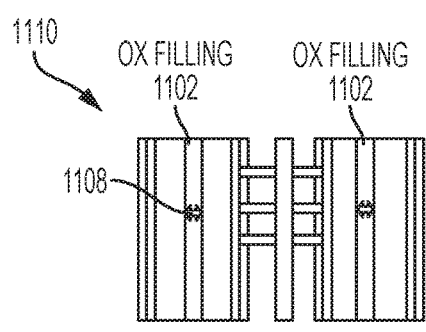
FIG. 11A depicts configuring an oxide filling volume to fill a volume of space near a semiconductor fin in accordance with embodiments of the present invention.

FIG. 11A depicts configuring an oxide filling volume to fill a volume of space near a semiconductor fin in accordance with embodiments of the present invention. FIG. 11A illustrates an embodiment where the oxide filling volumes 1102 are small, for device 1100. Specifically, in one embodiment, length 1108 of oxide filling volume 1102 is a shorter length, as compared to the length of oxide filling volume 1112 of FIG. 11B.

Figure 11B:
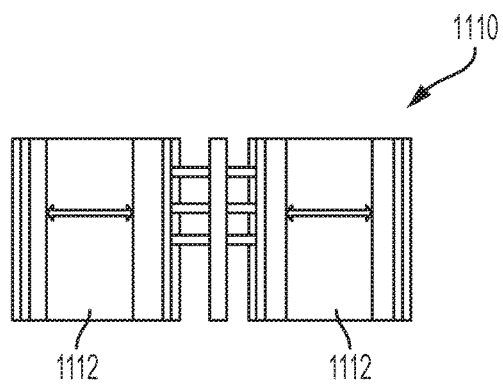
FIG. 11B depicts configuring another oxide filling volume to fill a volume of space near a semiconductor fin in accordance with embodiments of the present invention.

FIG. 11B depicts configuring another oxide filling volume to fill a volume of space near a semiconductor fin in accordance with embodiments of the present invention. FIG. 11B illustrates an embodiment where the oxide filling volume 1112 is larger, for device 1110. In general, a larger oxide filling volume will yield a larger induced stress. For example, with a larger volume of filled tensile stressor, after annealing is applied, the filled tensile stressor will experience a greater magnitude of shrinkage, and thus induce a greater magnitude of tensile stress. As such, in the case of tensile stressors and NFET devices, threshold voltages can be reduced as an oxide filling volume increases, in accordance with embodiments of the present invention. As the oxide-filling volume increases, the corresponding threshold voltages decrease.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments of the present invention described herein.

What is claimed is:
1. A method for forming a field-effect transistor device, the method comprising:
   forming a tensile stressor near and spaced apart from a first semiconductor fin, wherein the first semiconductor fin is a fin of an n-channel field-effect transistor, the tensile stressor is formed above the n-channel field-effect transistor, the n-channel field-effect transistor is formed on a substrate, and the tensile stressor is provided in separate volumes of space on both sides of the first semiconductor fin in a horizontal direction;

forming a compressive stressor near and spaced apart from a second semiconductor fin, wherein the second semiconductor fin is a fin of a p-channel field-effect transistor, the compressive stressor is formed above the p-channel field-effect transistor, the p-channel field-effect transistor is formed on the substrate, and the compressive stressor is provided in separate volumes of space on both sides of the second semiconductor fin in the horizontal direction; and configuring a first distance between the tensile stressor and an edge of the first semiconductor fin to be greater than 0 nm and less than 200 nm, wherein, in a cross-sectional view, the first distance is measured in the horizontal direction between the tensile stressor and the edge of the first semiconductor fin, the configured first distance corresponds to an increased amount of effective current for the n-channel field-effect transistor, and the first distance is configured to achieve a desired effective current for the n-channel field-effect transistor.

2. The method of claim 1, wherein the tensile stressor induces a tensile stress upon the first semiconductor fin, and the compressive stressor induces a compressive stress upon the second semiconductor fin.

3. The method of claim 1, wherein the tensile stressor comprises at least one of $SiO_2$, SiON, and amorphous silicon.

4. The method of claim 1, wherein the compressive stressor comprises at least one of $SiO_2$ and SiN.

5. The method of claim 1, wherein the tensile stressor and the compressive stressor both comprise a neutral stress material.

6. The method of claim 1 further comprising performing at least one annealing upon the tensile and compressive stressor.

7. The method of claim 1 further comprising:
configuring at least one second distance between the compressive stressor and an edge of the second semiconductor fin, wherein a shorter configured second distance corresponds to a smaller magnitude of threshold voltage for the p-channel field-effect transistor, and the at least one second distance is configured to achieve a desired threshold voltage for the p-channel field-effect transistor.

8. The method of claim 1 further comprising:
configuring a first volume occupied by the tensile stressor, wherein a larger configured first volume corresponds to a smaller magnitude of threshold voltage for the n-channel field-effect transistor, and the first volume is configured to achieve a desired threshold voltage for the n-channel field-effect transistor.

9. The method of claim 1 further comprising:
configuring at least one second volume occupied by the compressive stressor, wherein a larger configured second volume corresponds to a smaller magnitude of threshold voltage for the p-channel field-effect transistor, and the at least one second volume is configured to achieve a desired threshold voltage for the p-channel field-effect transistor.

10. A field-effect transistor device comprising:
at least one n-channel field-effect transistor comprising a first semiconductor fin, formed on a substrate;
at least one p-channel field-effect transistor comprising a second semiconductor fin, formed on the substrate;
a tensile stressor formed near and spaced apart from the first semiconductor fin of the at least one n-channel field-effect transistor, wherein the tensile stressor is formed above the at least one n-channel field-effect transistor, and the tensile stressor is provided in separate volumes of space on both sides of the first semiconductor fin in a horizontal direction; and
a compressive stressor formed near and spaced apart from the second semiconductor fin of the at least one p-channel field-effect transistor, wherein the compressive stressor is formed above the at least one p-channel field-effect transistor, the compressive stressor is provided in separate volumes of space on both sides of the second semiconductor fin in the horizontal direction, a first distance greater than 0 nm and less than 200 nm is configured between the tensile stressor and an edge of the first semiconductor fin, wherein, in a cross-sectional view, the first distance is measured in the horizontal direction between the tensile stressor and the edge of the first semiconductor fin, the configured first distance corresponds to an increased amount of effective current for the n-channel field-effect transistor, and the first distance is configured to achieve a desired effective current for the n-channel field-effect transistor.

11. The apparatus of claim 10, wherein the tensile stressor induces a tensile stress upon the first semiconductor fin, and the compressive stressor induces a compressive stress upon the second semiconductor fin.

12. The apparatus of claim 10, wherein the tensile stressor comprises at least one of $SiO_2$, SiON, and amorphous silicon.

13. The apparatus of claim 10, wherein the compressive stressor comprises at least one of $SiO_2$ and SiN.

14. The apparatus of claim 10, wherein the tensile stressor and the compressive stressor both comprise a neutral stress material.

15. The apparatus of claim 10, wherein at least one annealing has been performed.

16. The apparatus of claim 10, wherein at least one second distance is configured between the compressive stressor and an edge of the second semiconductor fin, a shorter configured second distance corresponds to a smaller threshold voltage for the p-channel field-effect transistor, and the at least one second distance is configured to achieve a desired threshold voltage for the p-channel field-effect transistor.

17. The apparatus of claim 10, wherein a first volume occupied by the tensile stressor is configured to achieve a desired threshold voltage for the n-channel field-effect transistor, and a larger configured first volume corresponds to a smaller magnitude of threshold voltage for the n-channel field-effect transistor.

18. The apparatus of claim 10, wherein at least one second volume occupied by the compressive stressor is configured to achieve a desired threshold voltage for the p-channel field-effect transistor, and a larger configured second volume corresponds to a smaller magnitude of threshold voltage for the p-channel field-effect transistor.

* * * * *